United States Patent [19]
Heumann et al.

[11] Patent Number: 5,489,851
[45] Date of Patent: Feb. 6, 1996

[54] IDENTIFICATION OF PIN-OPEN FAULTS BY MEASURING CURRENT OR VOLTAGE CHANGE RESULTING FROM TEMPERATURE CHANGE

[75] Inventors: John M. Heumann, Loveland; Ronald J. Peiffer, Ft. Collins, both of Colo.

[73] Assignee: Hewlett-Packard Company, Palo Alto, Calif.

[21] Appl. No.: 349,709

[22] Filed: Dec. 5, 1994

Related U.S. Application Data

[63] Continuation of Ser. No. 245,884, May 19, 1994, abandoned, which is a continuation of Ser. No. 926,794, Aug. 6, 1992, abandoned.

[51] Int. Cl.$^6$ .................................................. G01R 31/00
[52] U.S. Cl. .................... 324/537; 324/523; 324/756; 324/760
[58] Field of Search ........................... 324/522, 523, 324/537, 538, 600, 602, 713, 714, 715, 756, 760; 340/652–653

[56] References Cited

U.S. PATENT DOCUMENTS

| | | | |
|---|---|---|---|
| 3,842,346 | 10/1974 | Bobbitt | 324/537 |
| 4,578,637 | 3/1986 | Allen et al. | 324/537 |
| 4,683,422 | 7/1987 | Goodson | 324/715 X |
| 4,779,041 | 10/1988 | Williamson, Jr. | 324/537 |
| 5,111,137 | 5/1992 | Heumann et al. | 324/158 |
| 5,124,660 | 6/1992 | Cilingiroglu | 324/538 |
| 5,162,742 | 11/1992 | Atkins et al. | 324/537 X |

OTHER PUBLICATIONS

Grove, A., Physics and Technology of Semiconductor Devices, John Wiley and Sons, Inc., 1967, pp. 178, 188, Figures 6.19b and 6.23b.

Primary Examiner—Kenneth A. Wieder
Assistant Examiner—Christopher M. Tobin
Attorney, Agent, or Firm—Augustus W. Winfield

[57] ABSTRACT

A method and apparatus for determining whether semiconductor components are electrically connected to a printed circuit board. A voltage (or current) is connected to two traces leading to connections to a semiconductor component to be tested. The initial current (or voltage) is measured at an initial temperature. Then, the temperature of the semiconductor is changed. Current (or voltage) is measured again after the temperature change. A change in current (or voltage) indicates that the semiconductor component is electrically connected to the trace.

28 Claims, 6 Drawing Sheets

IDENTIFICATION OF PIN-OPEN FAULTS BY MEASURING CURRENT OR VOLTAGE CHANGE RESULTING FROM TEMPERATURE CHANGE

CROSS REFERENCE TO RELATED APPLICATIONS

This is a continuation of application Ser. No. 08/245,884 filed on May 19, 1994, now abandoned, which was a continuation of application Ser. No. 07/926,794, filed on Aug. 6, 1992, now abandoned.

FIELD OF INVENTION

This invention relates to electrical measuring and testing and more particularly to testing of connections between an integrated circuit and a printed circuit board.

BACKGROUND OF THE INVENTION

An important problem in electronics manufacturing is automatic verification of connection between a component or a component lead and a trace on a printed circuit board. The problem is especially important for surface mount large scale integrated circuits with high lead counts and high lead density, where the soldering process often leaves some leads unconnected. It is also an important problem for large scale integrated circuits placed in sockets where leads may be bent or sockets may not make contact.

In general, electrical verification of a connection requires stimulating a device under test and detecting an electrical response which indicates the presence of a viable connection. In general, the problem is complicated by parallel electrical paths. It is difficult to isolate a single lead if a stimulus induces electrical responses in multiple parallel paths.

An example prior art solution is disclosed in U.S. Pat. No. 5,111,137. That patent discloses a system in which intact electrical paths are detected by measuring a change in semiconductor leakage current resulting from irradiating a semiconductor with ionizing radiation such as x-rays. The primary stimulus is a voltage applied to a trace on a printed circuit board. The voltage results in a leakage current through diodes in the attached semiconductor devices. A secondary stimulus (ionizing radiation) then induces a change in that leakage current for one device. An individual semiconductor device is irradiated and any change in current is detected. A change in current during irradiation indicates that a semiconductor device is present, that there is an intact connection between the semiconductor device and the trace on the printed circuit board, that bond wires to the integrated circuit are intact, and that there is an intact connection from the integrated circuit to ground.

In general, ionizing radiation sources such as x-rays create safety concerns and require extensive measures to protect human operators. In addition, x-rays may damage some crystals, some thin-oxide MOS-FETs or other particularly sensitive parts. There is a need for a simpler, safer system to induce a change in current.

SUMMARY OF THE INVENTION

The preferred embodiment of the present invention measures diode current as disclosed in U.S. Pat. No. 5,111,137 or a corresponding voltage, but uses a simpler, safer secondary stimulus. The present invention uses temperature change instead of ionizing radiation for the secondary stimulus. In one embodiment of the present invention, a voltage is applied across traces on a printed circuit board and the resulting current is measured. In an alternative embodiment, a current source is applied to a device and the resulting voltage measured. An individual semiconductor device is then heated or cooled while monitoring the current or voltage. For most semiconductor devices, current at constant voltage varies several orders of magnitude with a 50 degree (Centigrade) temperature change. Even if there are parallel paths, the change in overall current resulting from a current change in one device can be detected. A change in current indicates that a semiconductor device is present, that there is an intact connection between the semiconductor device and the trace on the printed circuit board, that bond wires to the integrated circuit are intact, and that there is an intact connection from the integrated circuit to the printed circuit traces.

Temperature change has an advantage over ionizing radiation in that diode current at constant voltage varies linearly with intensity of ionizing radiation but varies faster than linearly with temperature. In addition, both forward and reverse biased current are strongly affected. Although thermal time constants are relatively long, overall throughput is still acceptable because several hundred leads on one device can all be tested during one temperature cycle.

There are numerous ways to change the temperature of a device. Devices can be individually heated by a non-contacting infrared source, individually heated by contact with a heat source or individually cooled by contact with a heat sink.

Probing may be accomplished by using bed-of-nails fixtures which are common in commercial board testers. Alternatively, connections can be sequentially probed one at a time in a low cost fixtureless test system with or without robotic probing.

DETAILED DESCRIPTION OF THE PREFERRED EMBODIMENT OF THE INVENTION

Figure 1:
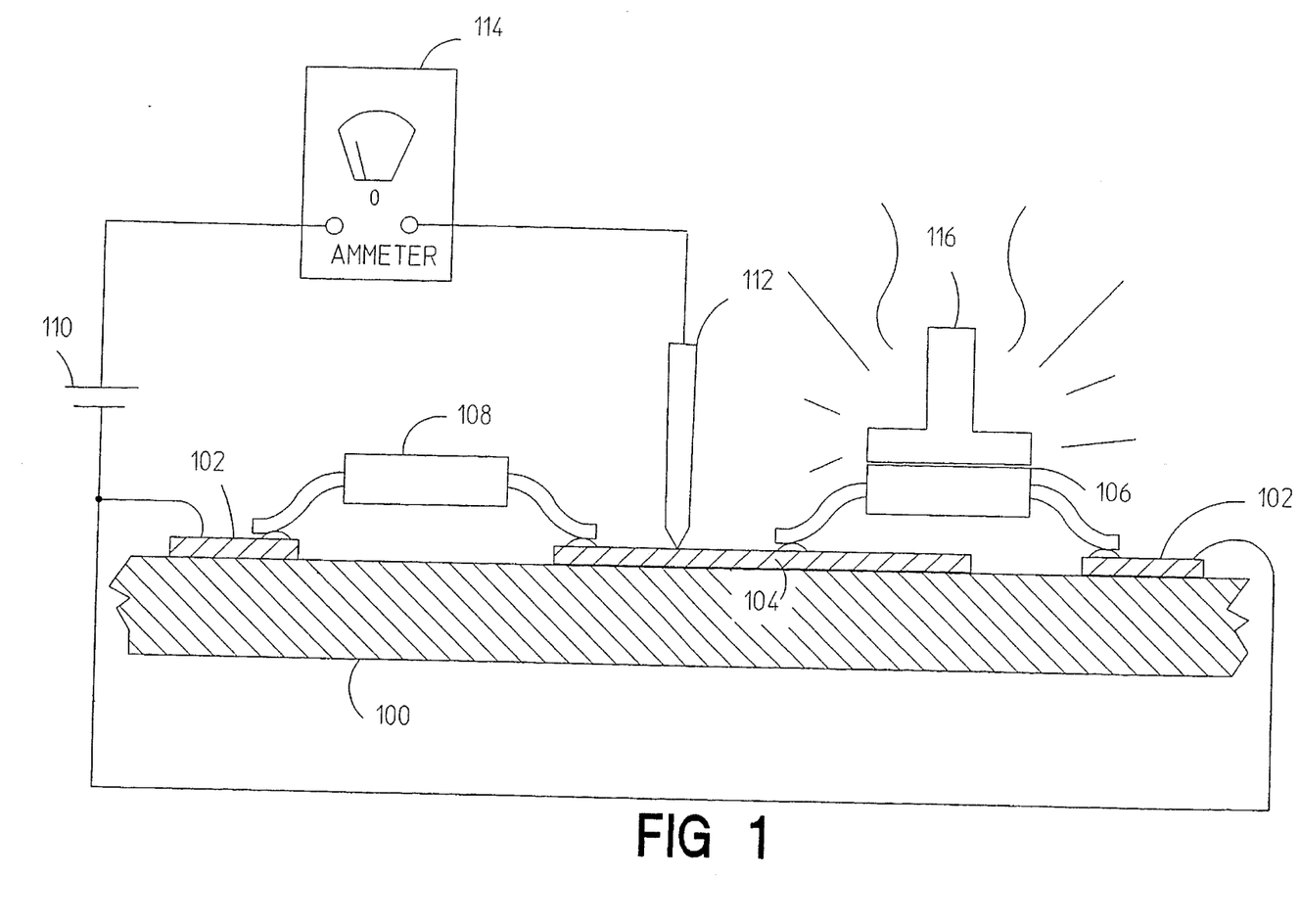
FIG. 1 is a mechanical cross section illustrating a printed circuit board with components and also includes a simplified electrical schematic illustrating a stimulus/measurement device electrically connected to the printed circuit board.

FIG. 1 illustrates a mechanical cross sectional view of a printed circuit board 100 with a first conductive trace 102 (illustrated as two sections but electrically connected together) and a second conductive trace 104. Two integrated circuits with connecting leads are also illustrated in mechanical cross section. A first integrated circuit 106 is connected between trace 102 and trace 104. The first integrated circuit 106 is heated by a contacting thermal transfer device 116. A second integrated circuit 108 is also connected between trace 102 and trace 104. For the integrated circuit leads shown in cross section, integrated circuits 106 and 108 are connected in parallel.

FIG. 1 also illustrates a simplified electrical schematic of a voltage source 110 driving a sharp probe 112 which makes electrical contact with trace 104. The resulting current flow is measured by ammeter 114. Ammeter 114 measures current before and after the first integrated circuit 106 is heated. A change in current with heating indicates that integrated circuit 106 is present and electrically connected between trace 102 and trace 104.

Figure 2:
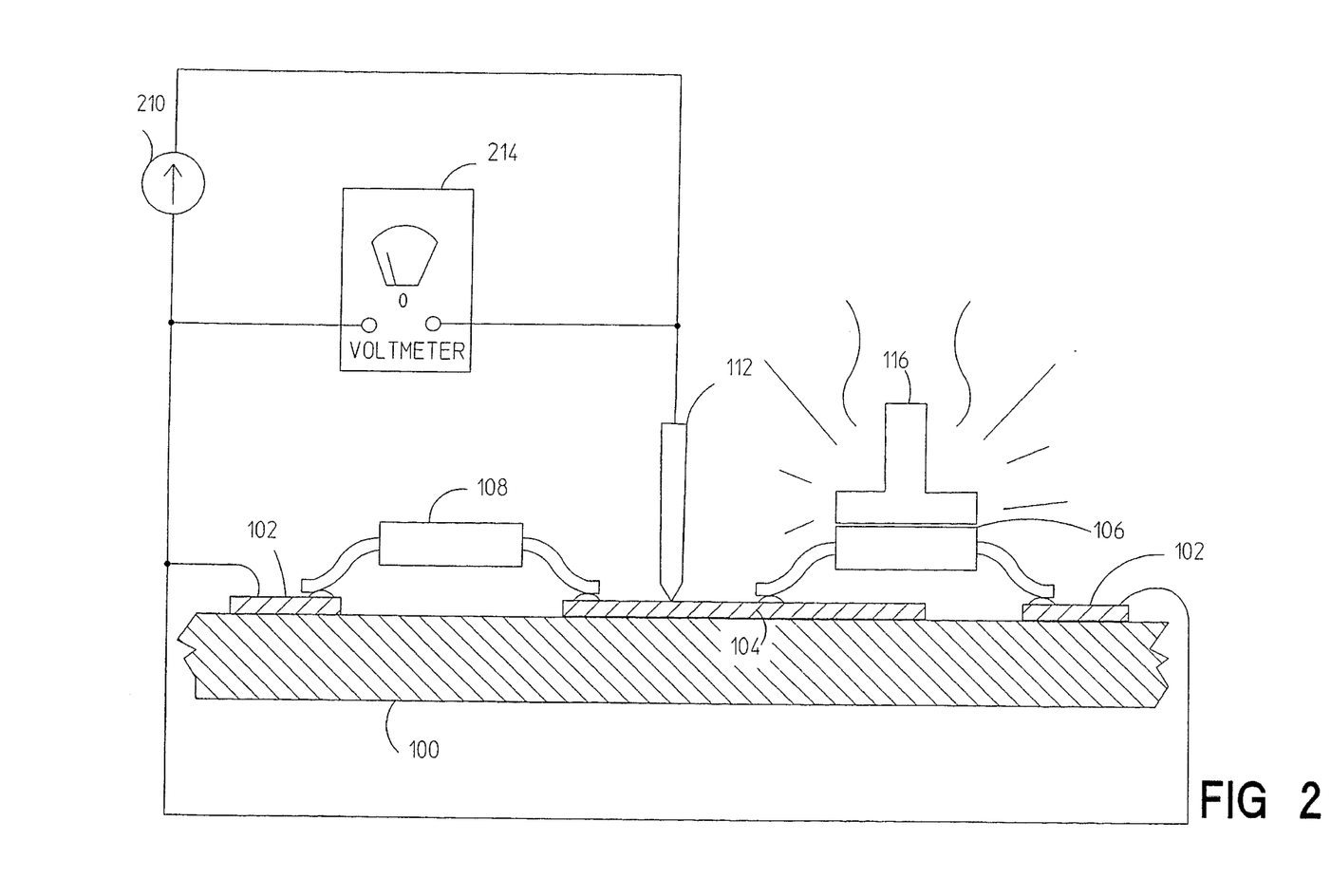
FIG. 2 is a mechanical cross section as in FIG. 1 but with an alternative configuration of a stimulus/measurement device.

FIG. 2 illustrates the same mechanical cross section as FIG. 1. However, in FIG. 2, a current source 210 drives the sharp probe 112 and the resulting voltage is measured by voltmeter 214.

In most common logic families, parasitic or protection diodes are found between each input or output pin and the supply rails. CMOS devices, for example, have parasitic diodes on outputs and protection diodes on inputs. In FIG. 1 and FIG. 2, the only testability requirement for conductive traces 102 and 104 is that there must be an effective diode (within device 106) between the traces. In addition, during testing the traces may be used in a manner which is different than the way they are used in normal operation. For example, during normal operation trace 102 might be a power supply trace, but during testing trace 102 might be temporarily connected to ground to provide a diode current path for the voltage source 110 or current source 210.

FIGS. 1 and 2 illustrate surface mount devices 106 and 108 with soldered leads. However, the invention is equally applicable to leadless surface mount devices or through-hole components. The invention detects electrical continuity, whether through soldered leads, soldered surface mount contacts on leadless devices, contacts in a socket, elastomer interconnects, or other device-to-board connection methods.

For temperature change, it does not matter whether the stimulus (voltage source 110 in FIG. 1 or current source 210 in FIG. 2) biases the diode being tested in the forward direction or in the reverse direction. For forward or reverse biased diodes, an increase in temperature at constant voltage results in an increase in current. Alternatively, an increase in temperature at constant current results in a drop in voltage. Overall current as a function of voltage is given by the following well known equation:

$$I \approx I_o \left( e^{\frac{qV}{kT}} - 1 \right)$$

This equation alone does not adequately describe the overall effect of temperature, however, since $I_o$ is itself a strong function of temperature. For equations and graphs describing current and voltage as a function of temperature under various conditions, see Grove, A., *Physics and Technology of Semiconductor Devices*, John Wiley and Sons, Inc., 1967. In Grove, FIG. 6.19*b* (p 178) illustrates reverse current-voltage characteristics for silicon diodes and FIG. 6.23*b* (p188) illustrates forward current-voltage characteristics for silicon diodes.

Figure 3:
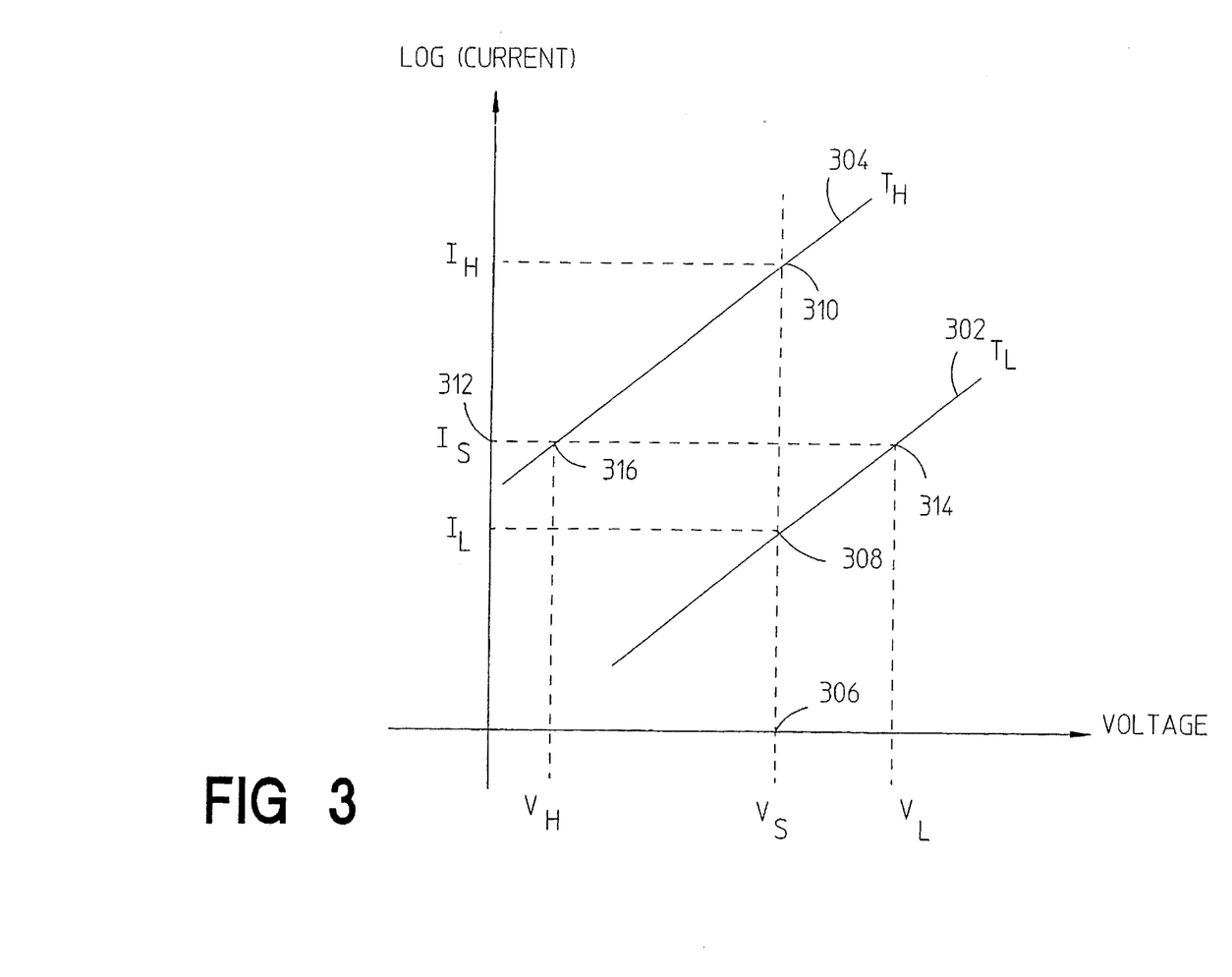
FIG. 3 is a graph (not to scale) illustrating log(current) as a function of voltage, at two different temperatures, for a diode.

FIG. 3 (not to scale) illustrates the general principle. In FIG. 3, line 302 represents diode voltage as a function of log(current) at a lower temperature $T_L$. Line 304 illustrates diode voltage as a function of log(current) at a higher temperature $T_H$. For a test configured as illustrated in FIG. 1, FIG. 3 illustrates a constant voltage source 306 ($V_s$) applied to a diode. In FIG. 3, current 308 ($I_L$) is measured at the lower temperature $T_L$ and current 310 ($I_L$) is measured at higher temperature $T_H$. For a test configured as illustrated in FIG. 2, FIG. 3 illustrates a constant current source 312 ($I_S$) applied to a diode. In FIG. 3, voltage 314 ($V_L$) is measured at the lower temperature $T_L$ and voltage 316 ($V_H$) is measured at the higher temperature $T_H$.

The following examples are approximate numbers extracted from FIGS. 6.19*b* and 6.23*b* in Grove. For a reverse biased silicon diode at 0.2 V, heating from 25° C. to 75° C. results in a current change from 10 pA to 800 pA. For a forward biased silicon diode at 0.2 V, heating from 25° C. to 75° C. results in a current change from 1 nA to 90 nA. For a reversed biased silicon diode at 100 pA, heating from 25° C. to 75° C. results in a voltage change from 8 V to 0.02 V. For a forward biased silicon diode at 100 pA, heating from 25° C. to 75° C. results in a voltage change from about 0.1 V to essentially 0 V (not discernable in FIG. 6.23*b* in Grove).

In general, total parallel current may be greater than the current through the device under test. For a DC measurement, the change in current resulting from the device under test must be greater than the noise level. For high noise situations, multiple DC measurements on each trace can be averaged to improve the signal to noise ratio. Alternatively, an AC or pulsed measurement can be used with synchronous detection methods to detect a signal buried in noise.

In the preferred embodiment, probe 112 illustrated in FIG. 1 is a "nail" in a bed-of-nails test fixture. An example of a commercially available test system employing such fixtures is the Hewlett Packard 3070 family of board test systems. In these systems, each probe (nail) can be connected via multiplexing circuitry to current and voltage measuring instrumentation.

In an alternative embodiment, the probe 112 illustrated in FIG. 1 is a single hand-held or robotically controlled probe connected to a test instrument for sequentially testing leads one at a time. A commercially available instrument suitable for ammeter 114 illustrated in FIG. 1 or voltmeter 214 in FIG. 2 is the Hewlett Packard 3458 digital multimeter.

Figure 4:
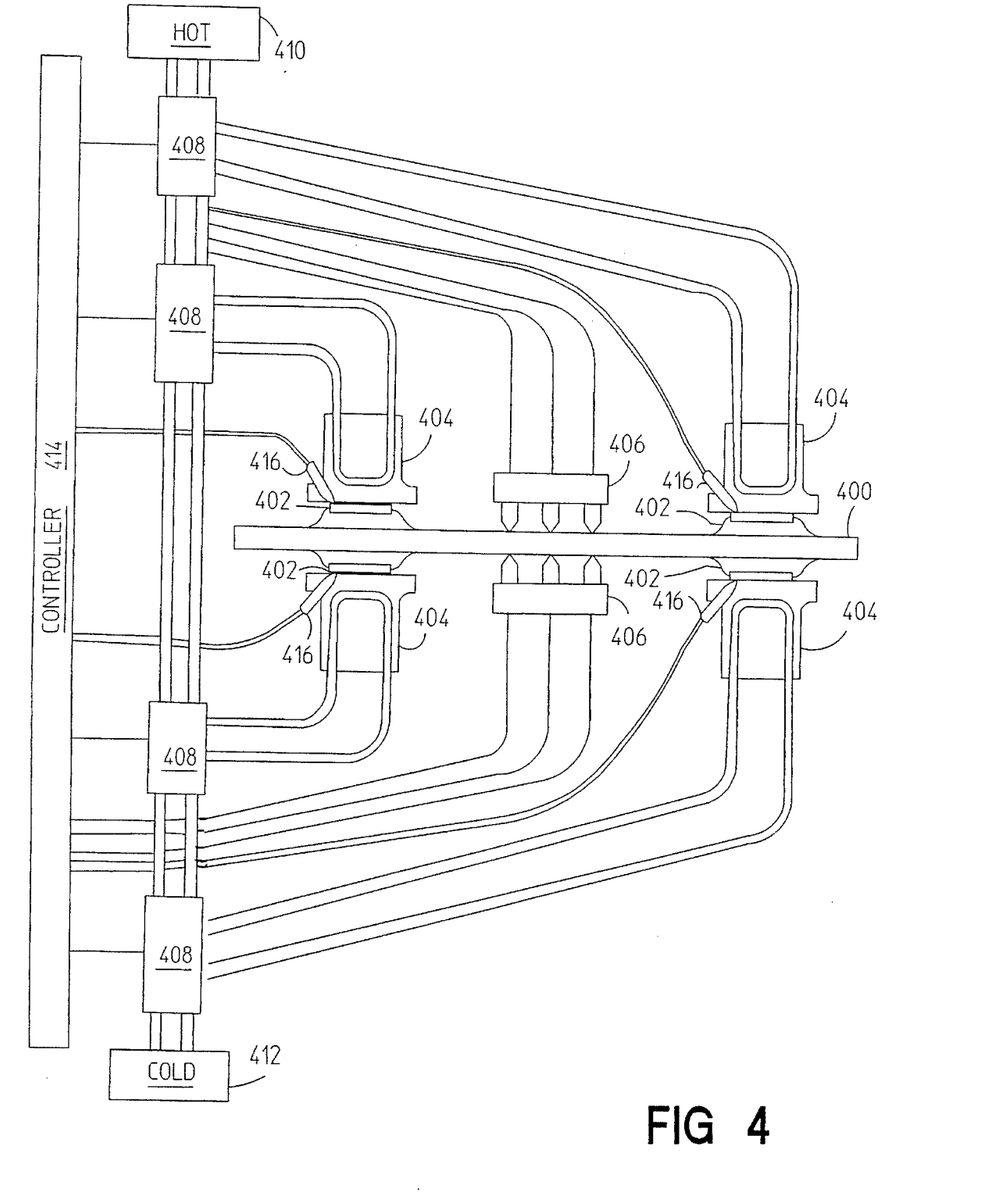
FIG. 4 is a mechanical cross section illustrating the preferred embodiment of a test system incorporating the present invention.

FIG. 4 illustrates a mechanical cross section of a test system in accordance with the preferred embodiment of the present invention. A double-sided printed circuit board 400 has four attached semiconductor components 402. Each semiconductor component 402 is in mechanical contact with a thermal transfer device 404. Traces on the printed circuit board are being probed with bed-of-nails fixtures 406. A hot fluid 410 or a cold fluid 412 is selectively pumped through valves 408 and through one or more of the thermal transfer devices 404. Temperature sensing probes 416 measure the temperature at the surface of each device for closed loop control of temperature. Valves 408 and bed-of-nails probes 406 are all electrically controlled by controller 414. The temperature sensing probes 416 also connect to controller 414 for temperature feedback.

In the preferred embodiment, the thermal transfer device (FIG. 4, 404) is realized as a thermal mass with circulating hot or cold fluid to provide rapid heat transfer. In the preferred embodiment, one device under test is heated while all other devices are actively maintained at ambient temperature. That is, temperature sensing probes 416 sense the temperature of devices surrounding the device under test and the temperature of surrounding devices is controlled. After testing, the device under test is actively cooled to return the device under test to ambient temperature in preparation for testing other devices. If lateral heat spread from the device under test is not a problem, the system can be simplified by eliminating active control of temperature of surrounding devices.

The system as illustrated can also be used to measure current or voltage when the device under test is cooled instead of heated. Alternatively, the system can measure current or voltage when the device under test is heated and again when the device under test is cooled. Alternatively, all devices may be cooled except the one device under test which is heated or all devices can be heated except the one device under test which is cooled.

Numerous other contacting or non-contacting methods can be used to heat or cool a device under test. One simple method is to take a pre-heated thermal mass (for example a block of steel) and place the heated mass in contact with the device under test. Other alternatives include direct contact with streams of hot or cold fluid (with proper shielding of adjacent components), evaporative refrigeration, heat pumps, heat pipes, infrared light sources or lasers, electric resistance (heating coils), and thermoelectric devices (Peltier effect devices).

In the preferred embodiment illustrated in FIG. 4, multiple thermal transfer devices 404 are mounted into a bed-of-nails fixture. In this configuration, there is a one-to-one correspondence between thermal transfer devices 404 and devices to be tested 402. Electrically controllable mechanical valves 408 are used to route fluid to and from a device 402 to be heated or cooled. In alternative embodiments with infrared lights, lasers or thermoelectric devices, electrical switching directly controls a thermal transfer device. Alternatively, in a simple fixtureless system, a single thermal transfer device is placed manually or is placed by a robotic device.

Figure 5:
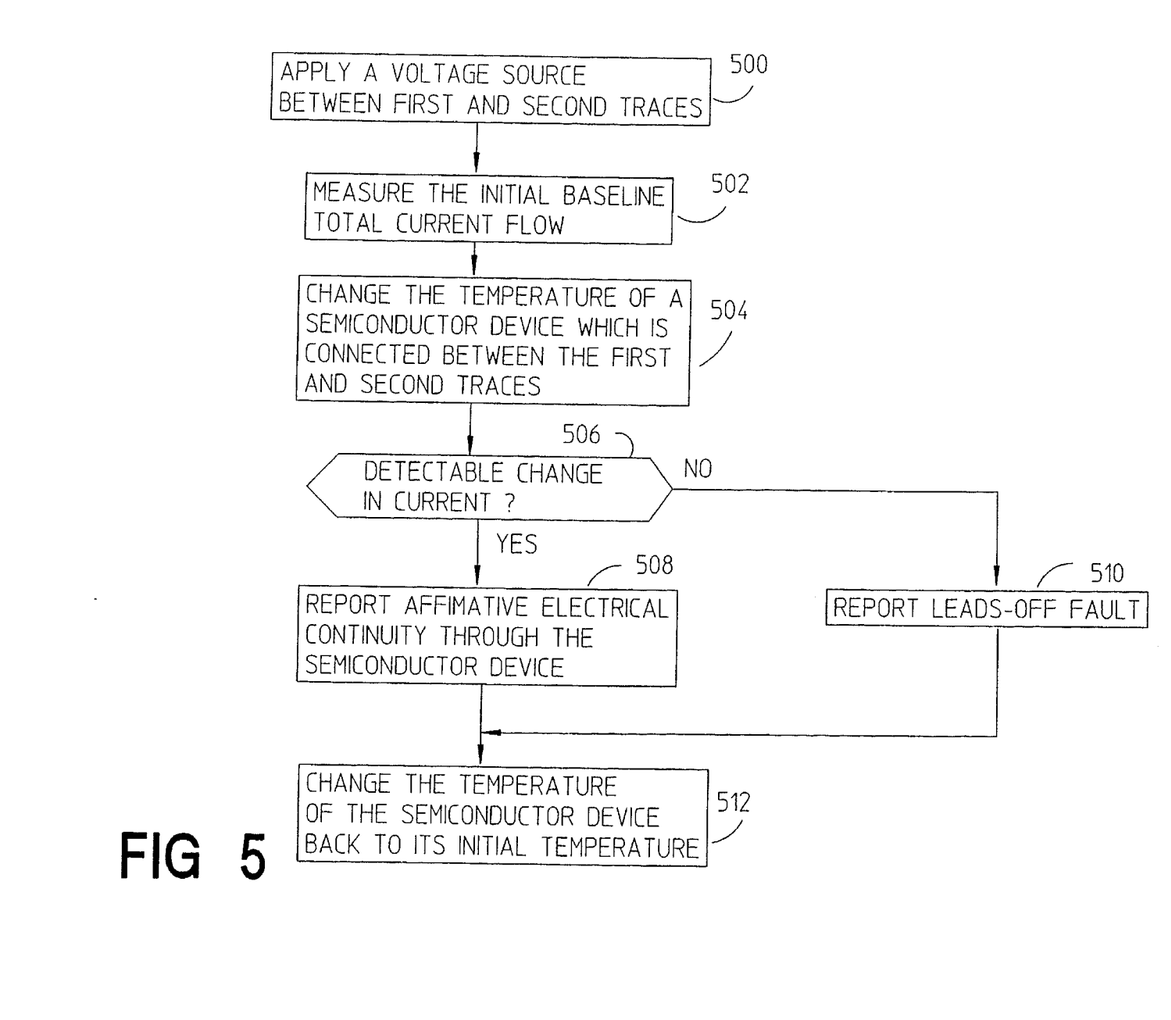
FIG. 5 is a flow chart illustrating the method of the present invention for the preferred embodiment.

FIG. 5 is a flow chart illustrating the method for the present invention for the embodiment illustrated in FIG. 1. The first step 500 is to apply a voltage between two traces. The second step 502 is to measure the initial baseline total current. The third step 504 is to change the temperature of a semiconductor device connected between the traces. The fourth step 506 is to detect any change in current. If a change is detected (step 508), then there is electrical continuity through the semiconductor. If no change is detected (step 510), electrical continuity cannot be verified and a leads-off fault is reported. The last step 512 is to return the device under test back to its initial temperature.

Figure 6:
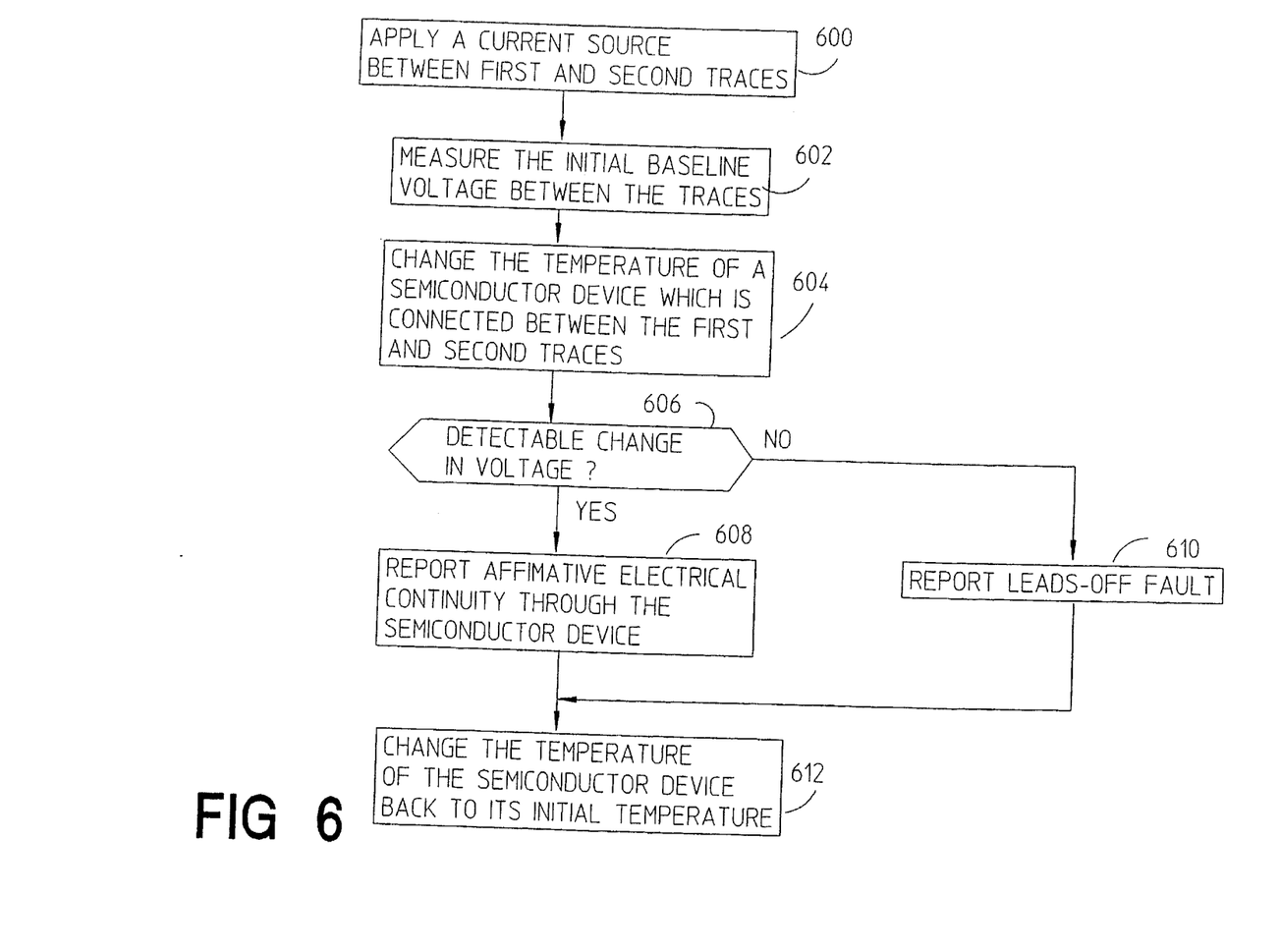
FIG. 6 is a flow chart illustrating the method of the present invention for an alternative embodiment.

FIG. 6 is a flow chart illustrating the method for the present invention for the embodiment illustrated in FIG. 2. The first step 600 is to apply a current source between two traces. The second step 602 is to measure the initial baseline voltage. The third step 604 is to change the temperature of a semiconductor device connected between the traces. The fourth step 606 is to detect any change in voltage. If a change is detected (step 608), then there is electrical continuity through the semiconductor. If no change is detected (step 610), electrical continuity cannot be verified and a leads-off fault is reported. The last step 612 is to return the device under test back to its initial temperature.

The foregoing description of the present invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. An apparatus for determining the quality of the mounting of a semiconductor device in a circuit board by verifying electrical continuity between first and second conductive paths and the semiconductor device, at least one additional conductive device connected between the first and second conductive paths, the semiconductor device having first and second contacts, the first contact associated with the first conductive path and the second contact associated with the second conductive path, the apparatus comprising:

a voltage source, electrically connected to the first and second conductive paths;

a current monitor, connected to monitor the current through the conducting paths and the at least one additional conductive device; and means for changing the temperature of the semiconductor devices, wherein a change in current through the first and second conducting paths monitored before and after the temperature change indicates electrical continuity through the semiconductor device.

2. The apparatus of claim 1 wherein the means for changing the temperature of the semiconductor device comprises a thermally conductive mass having an initial temperature different than an initial temperature of the semiconductor device, wherein the thermally conductive mass is placed in contact with the semiconductor device.

3. The apparatus of claim 2 further comprising a fluid flowing through the thermally conductive mass wherein heat transfers between the fluid and the thermally conductive mass.

4. The apparatus of claim 3 wherein the initial temperature of the semiconductor device is ambient temperature and the change in temperature of the semiconductor device is an increase in temperature.

5. The apparatus of claim 1 wherein the means for changing the temperature of the semiconductor device comprises a non-contacting source of infrared energy directing infrared energy on the surface of the semiconductor device.

6. The apparatus of claim 1 further comprising a plurality of adjacent components and a means for shielding the adjacent components wherein the means for changing the temperature of the semiconductor device comprises a fluid having a different temperature than an initial temperature of the semiconductor device, wherein the fluid is flowed over the surface of the semiconductor device and wherein the fluid is prevented from flowing over the adjacent components by the means for shielding.

7. The apparatus of claim 1 wherein the means for changing the temperature of the semiconductor device comprises a thermoelectric device in contact with the surface of the semiconductor device.

8. An apparatus for determining the quality of the mounting of a semiconductor device in a circuit board by verifying electrical continuity between first and second conductive paths and the semiconductor device, at least one additional conductive device connected between the first and second conductive paths, the semiconductor device having first and second contacts, the first contact associated with the first conductive path and the second contact associated with the second conductive path, the apparatus comprising:

a current source, electrically connected to the first and second conductive paths, the current flowing through the at least one additional conductive device;

a voltage monitor, connected to monitor voltage between the first and second conductive paths; and means for changing the temperature of the semiconductor device, wherein a change in voltage between the first and second conductive paths monitored before and after the temperature change indicates electrical continuity through the semiconductor device.

9. The apparatus of claim 8 wherein the means for changing the temperature of the semiconductor device comprises a thermally conductive mass having an initial temperature different than an initial temperature of the semiconductor device, wherein the thermally conductive mass is placed in contact with the semiconductor device.

10. The apparatus of claim 9 further comprising a fluid flowing through the thermally conductive mass wherein heat transfers between the fluid and the thermally conductive mass.

11. The apparatus of claim 10 wherein the initial temperature of the semiconductor device is ambient temperature and the change in temperature of the semiconductor device is an increase in temperature.

12. The apparatus of claim 8 wherein the means for changing the temperature of the semiconductor device comprises a non-contacting source of infrared energy directing infrared energy on the surface of the semiconductor device.

13. The apparatus of claim 8 further comprising a plurality of adjacent components and a means for shielding the adjacent components wherein the means for changing the temperature of the semiconductor device comprises a fluid having a different temperature than an initial temperature of the semiconductor device, wherein the fluid is flowed over the surface of the semiconductor device and wherein the fluid is prevented from flowing over the adjacent components by the means for shielding.

14. The apparatus of claim 8 wherein the means for changing the temperature of the semiconductor device comprises a thermoelectric device in contact with the surface of the semiconductor device.

15. A method for determining the quality of the mounting of a semiconductor device in a circuit board by verifying electrical continuity between first and second conductive paths and the semiconductor device, at least one additional conductive device connected between the first and second conductive paths, the semiconductor device having first and second contacts, the first contact associated with the first conductive path and the second contact associated with the second conductive path, the method comprising the steps of:

connecting a voltage source between the first and second conductive paths;

monitoring the current through the first and second conductive paths and the at least one additional conductive device; and changing the temperature of the semiconductor device, wherein a change in current through the first and second conductive paths monitored before and after the temperature change indicates electrical continuity through the semiconductor device.

16. The method of claim 15 wherein the step of changing the temperature of the semiconductor device comprises contacting the semiconductor device with a thermally conductive mass and flowing a fluid through the thermally conductive mass to transfer heat between the fluid and the thermally conductive mass.

17. The method of claim 15 wherein the step of changing the temperature of the semiconductor device comprises directing infrared energy from a non-contacting source of infrared energy onto the surface of the semiconductor device.

18. The method of claim 15 wherein the step of changing the temperature of the semiconductor device comprises flowing a fluid having a different temperature than an initial temperature of the semiconductor device over the surface of the semiconductor device and preventing the fluid from flowing over any adjacent components.

19. The method of claim 15 wherein the step of changing the temperature of the semiconductor device comprises placing a thermoelectric device in contact with the surface of the semiconductor device.

20. A method for determining the quality of the mounting of a semiconductor device in a circuit board by verifying electrical continuity between first and second conductive paths and the semiconductor device, at least one additional conductive device connected between the first and second conductive paths, the semiconductor device having first and second contacts, the first contact associated with the first conductive path and the second contact associated with the second conductive path, the method comprising the steps of:

connecting a current source between the first and second conductive paths, the current flowing through the at least one additional conductive device;

monitoring the voltage between the first and second conductive paths; and changing the temperature of the semiconductor device, wherein a change in voltage between the first and second conductive paths monitored before and after the temperature change indicates electrical continuity through the semiconductor device.

21. The method of claim 20 wherein the step of changing the temperature of the semiconductor device comprises contacting the semiconductor device with a thermally conductive mass and flowing a fluid through the thermally conductive mass to transfer heat between the fluid and the thermally conductive mass.

22. The method of claim 20 wherein the step of changing the temperature of the semiconductor device comprises directing infrared energy from a non-contacting source of infrared energy onto the surface of the semiconductor device.

23. The method of claim 20 wherein the step of changing the temperature of the semiconductor device comprises flowing a fluid having a different temperature than an initial temperature of the semiconductor device over the surface of the semiconductor device and preventing the fluid from flowing over any adjacent components.

24. The method of claim 20 wherein the step of changing the temperature of the semiconductor device comprises placing a thermoelectric device in contact with the surface of the semiconductor device.

25. An apparatus for determining the quality of the mounting of a semiconductor device in a circuit board by detecting an open circuit between first and second conductive paths and the semiconductor device intended to be connected between the first and second conductive paths, at least one additional conductive device connected between the first and second conductive paths, the apparatus comprising:

a voltage source, electrically connected to the first and second conductive paths;

a current monitor, connected to monitor the current through the first and second conducting paths; and means for changing the temperature of the semiconductor device, wherein an absence of change in current through the first and second conductive paths monitored before and after the temperature change indicates an open circuit between the first and second conductive paths and the semiconductor device.

26. An apparatus for determining the quality of the mounting of a semiconductor device in a circuit board by detecting an open circuit between first and second conductive paths and the semiconductor device intended to be connected between the first and second conductive paths, at least one additional conductive device connected between the first and second conductive paths, the apparatus comprising:

a current source, electrically connected to the first and second conductive paths;

a voltage monitor, connected to monitor the voltage between the first and second conducting paths; and means for changing the temperature of the semiconductor device, wherein an absence of change in voltage between the first and second conductive paths monitored before and after the temperature change indicates an open circuit between the first and second conductive paths and the semiconductor device.

27. A method for determining the quality of the mounting of a semiconductor device in a circuit board by detecting an open circuit between first and second conductive paths and the semiconductor device intended to be connected between the first and second conductive paths, at least one additional conductive device connected between the first and second conductive paths, the method comprising the following steps:

connecting a voltage source between the first and second conductive paths;

monitoring the current through the conductive paths; and changing the temperature of the semiconductor device, wherein an absence of change in current through the first and second conductive paths monitored before and after the temperature change indicates an open circuit between the first and second conductive paths and the semiconductor device.

28. A method for determining the quality of the mounting of a semiconductor device in a circuit board by detecting an open circuit between first and second conductive paths and the semiconductor device intended to be connected between the first and second conductive paths, at least one additional conductive device connected between the first and second conductive paths, the method comprising the following steps:

connecting a current source between the first and second conductive paths;

monitoring the voltage between the first and second conductive paths; and changing the temperature of the semiconductor device, wherein an absence of change in voltage between the first and second conductive paths monitored before and after the temperature change indicates an open circuit between the first and second conductive paths and the semiconductor device.

* * * * *